(12) United States Patent
Ehlen (10) Patent No.: US 10,015,903 B1
(45) Date of Patent: Jul. 3, 2018

(54) HIGH POWER SAFETY SLED (71) Applicant: Facebook, Inc., Menlo Park, CA (US)

(72) Inventor: Jon Brian Ehlen, Newark, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/619,407

(22) Filed: Jun. 9, 2017

(51) Int. Cl.
*H05K 7/14* (2006.01)

(52) U.S. Cl.
CPC .................................. *H05K 7/1492* (2013.01)

(58) Field of Classification Search
CPC ..... H05K 7/1492; H05K 7/1489; H01R 41/00
USPC .................................................. 361/724–727
See application file for complete search history.

(56) References Cited

U.S. PATENT DOCUMENTS

| | | | |
|---|---|---|---|
| 4,017,770 A | 4/1977 | Valfre | |
| 5,618,197 A | 4/1997 | Bodahl-Johnsen et al. | |
| 6,115,242 A | 9/2000 | Lambrecht | |
| 6,209,979 B1 | 4/2001 | Fall | |
| 6,239,975 B1 | 5/2001 | Otis | |
| 7,142,411 B2 * | 11/2006 | McLeod | G06F 1/182 361/624 |
| 7,661,966 B2 * | 2/2010 | Ohanesian | H01R 25/142 439/120 |
| 7,784,888 B2 | 8/2010 | Oh et al. | |
| 8,109,652 B2 * | 2/2012 | Chen | F21V 19/0045 362/218 |
| 8,911,251 B2 | 12/2014 | Ehlen | |
| 9,450,358 B2 | 9/2016 | Ehlen | |
| 9,693,477 B1 | 6/2017 | Ehlen | |
| 2002/0112945 A1 * | 8/2002 | Lawson | H01R 13/701 200/50.28 |
| 2004/0105187 A1 * | 6/2004 | Woodruff | G11B 15/6825 360/92.1 |
| 2010/0149737 A1 * | 6/2010 | Shtargot | G06F 1/183 361/679.02 |
| 2013/0286575 A1 * | 10/2013 | Chen | G06F 1/189 361/679.02 |
| 2013/0335913 A1 * | 12/2013 | Brashers | G06F 1/187 361/679.39 |
| 2014/0113473 A1 | 4/2014 | Ehlen | |
| 2014/0308828 A1 | 10/2014 | Ehlen et al. | |

(Continued)

OTHER PUBLICATIONS

U.S. Appl. No. 13/655,343 by Ehlen, J., filed Oct. 18, 2012.

(Continued)

*Primary Examiner* — Hoa C Nguyen
*Assistant Examiner* — Christopher L Augustin
(74) *Attorney, Agent, or Firm* — FisherBroyles, LLP (57) ABSTRACT

Technology is provided for a device platform with a moveable conductor cover. The device platform includes a power tray, a power supply, and a device sled. The power tray includes a tray chassis having a pair of conductors extending along a portion of the tray chassis. The power tray includes a conductor cover moveable to cover and uncover the pair of conductors. The power supply is connected to the pair of conductors. The device sled is moveable relative to the pair of conductors between a powered position where the conductors are uncovered and an unpowered position where the conductors are covered. The device sled includes a sled chassis, a chassis panel mounted to the sled chassis, and a pair of conductive elements mounted on the chassis panel and positioned for sliding contact with the pair of conductors when the device sled is in the powered position.

20 Claims, 6 Drawing Sheets

(56) References Cited

U.S. PATENT DOCUMENTS

2015/0375045 A1* 12/2015 Ojanen .............. A63B 23/0405
                                                                482/5
2016/0150681 A1*  5/2016 Leigh ................... H05K 7/1492
                                                            361/679.46

OTHER PUBLICATIONS

U.S. Appl. No. 14/314,746 by Ehlen, J., filed Jun. 25, 2014.
U.S. Appl. No. 15/172,982 by Ehlen, J., filed Jun. 3, 2016.
Non-Final Office Action dated May 2, 2014, U.S. Appl. No. 13/655,343 by Ehlen, J., filed Oct. 18, 2012.
Notice of Allowance dated Aug. 27, 2014 for U.S. Appl. No. 13/655,343 by Ehlen, J., filed Oct. 18, 2012.
Notice of Allowance dated Oct. 22, 2014 for U.S. Appl. No. 13/655,343 by Ehlen, J., filed Oct. 18, 2012.
Notice of Allowance dated Jul. 13, 2016, for U.S. Patent Application No. 14/314,746 by Ehlen, J., filed Jun. 25, 2014.
Notice of Allowance dated Apr. 12, 2017, for U.S. Patent Application No. 15/172,982 by Ehlen, J., filed Jun. 3, 2016.

* cited by examiner

FIG. 6

HIGH POWER SAFETY SLED

TECHNICAL FIELD

This patent application generally relates to data storage server configurations, and more specifically, to a powered server tray assembly.

BACKGROUND

Existing server platforms generally derive their power from a power distribution unit (PDU) mounted to a rack. In some cases, the rack has a powered bus bar running the height of the rack that multiple server platforms connect to with a power input connector engaging the powered bus bar. Thus, in order to test one or more servers, the server platform must be mounted in the rack and connected to the PDU or powered bus bar. The confined space of a rack can make testing a server difficult. Accordingly, there is a need to safely and conveniently power a server platform without installation in a rack for bench top testing.

BRIEF DESCRIPTION OF THE DRAWINGS

Embodiments of the high power safety sled disclosed herein may be better understood by referring to the following Detailed Description in conjunction with the accompanying drawings, in which like reference numerals indicate identical or functionally similar elements.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to unnecessarily limit the embodiments described. On the contrary, the embodiments are intended to cover all suitable modifications, equivalents, and alternatives falling within the scope of the embodiments as defined by the appended claims.

DETAILED DESCRIPTION

Overview

A device platform suitable for high power bench top testing is disclosed. In a representative embodiment the device platform can include a power tray and a device sled positioned on the power tray and movable between an unpowered position and a powered position. In the unpowered position the high power conductors used to power the device sled are covered thereby preventing a user from contacting the conductors. The power tray can include a tray chassis having a tray sidewall and a tray bottom wall with a pair of conductors extending along at least a portion of the tray bottom wall. A conductor cover is positioned on the tray chassis and is moveable between a first position where the pair of conductors are covered and a second position where the pair of conductors are exposed. In some embodiments, the conductor cover is biased toward the first position with extension springs, for example. A power supply is connected to the pair of conductors to provide power to the device sled.

The device sled is movable relative to the pair of conductors between the unpowered position where the conductor cover is in the first position and the powered position where the conductor cover is in the second position. In some embodiments, the device sled includes a sled chassis having a chassis sidewall and a chassis bottom wall adjacent to the tray sidewall and tray bottom wall, respectively. Two or more conductive elements can be positioned on the chassis bottom wall for sliding contact with the pair of conductors, when the server sled is in the powered position.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

Figure 1A:
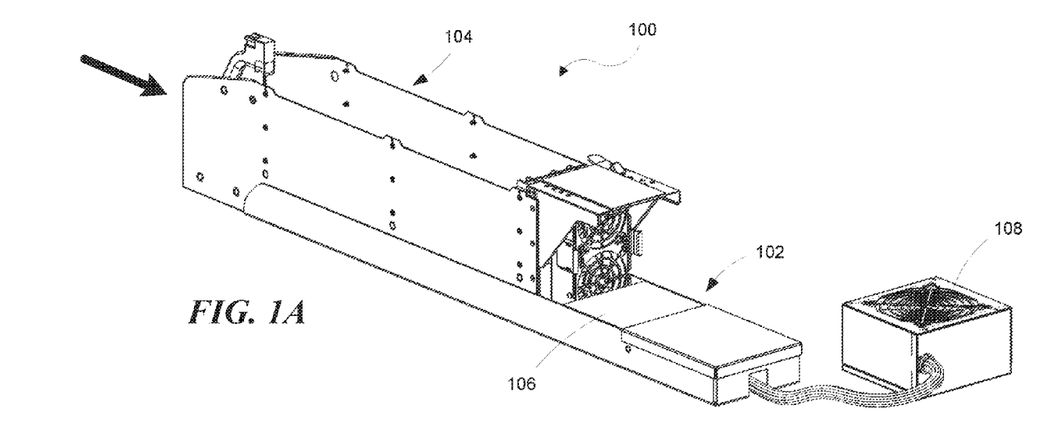
FIG. 1A is an isometric view of a device sled and a power tray according to a representative embodiment with the device sled in an unpowered position.
Figure 1B:
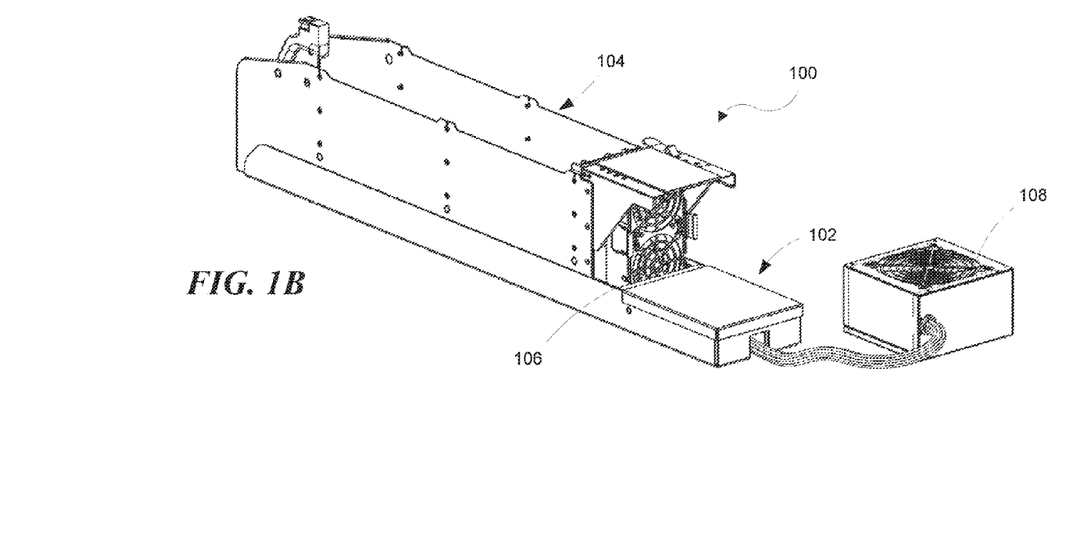
FIG. 1B is an isometric view of the device sled and the power tray shown in FIG. 1A with the device sled in a powered position.

As shown in FIGS. 1A and 1B, the device (e.g., server and/or memory) platform 100 includes a power tray 102, a power supply 108, and a device sled 104. The device sled 104 is positioned on the power tray 102 and movable between an unpowered position (FIG. 1A) and a powered position (FIG. 1B). In the unpowered position the high power conductors used to power the device sled 104 are covered by a conductor cover 106 thereby preventing a user from contacting the conductors. The conductor cover 106 moves with the device sled 104 as the device sled is moved from the unpowered position to the powered position.

Figures 2A, 2B:
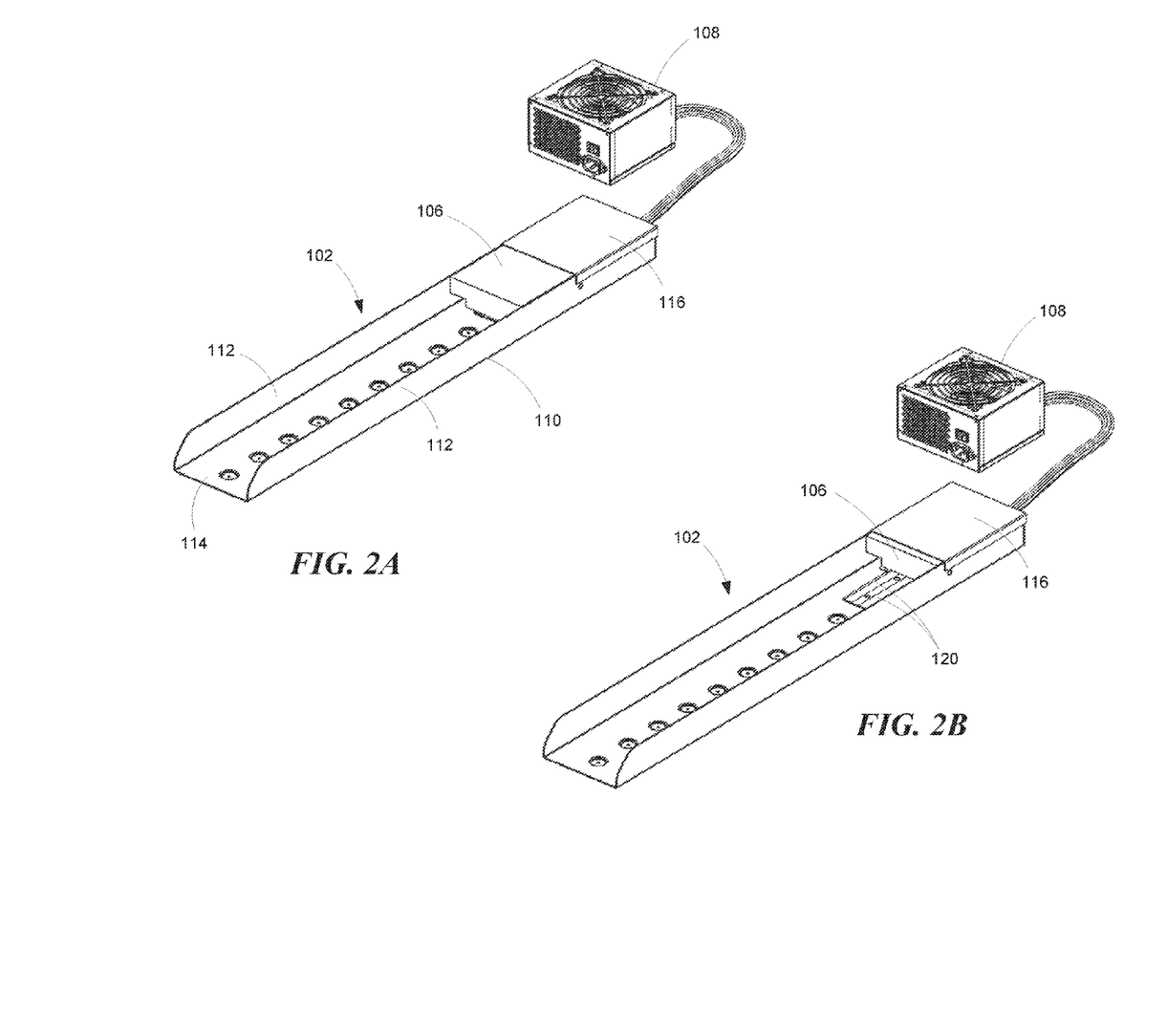
FIG. 2A is an isometric view of the power tray shown in FIGS. 1A and 1B with a conductor cover in a first position corresponding to the unpowered sled position.
FIG. 2B is an isometric view of the power tray shown in FIG. 2A with the conductor cover in a second position corresponding to the powered sled position.

With reference to FIGS. 2A and 2B, the power tray 102 includes a tray chassis 110 having a bottom wall 114 and a pair of opposed sidewalls 112. The conductor cover 106 is positioned in the tray chassis 110 between the sidewalls 112. A stationary cover 116 is positioned on top of the tray chassis 110 to conceal the power connections within the power tray 102. The conductor cover 106 is moveable between a first position (FIG. 2A) corresponding to the unpowered sled position where the pair of elongate conductors 120 are covered and a second position (FIG. 2B) corresponding to the powered sled position where the pair of elongate conductors 120 are exposed for connection to the device sled 104 (FIGS. 1A and 1B).

Figure 3A:
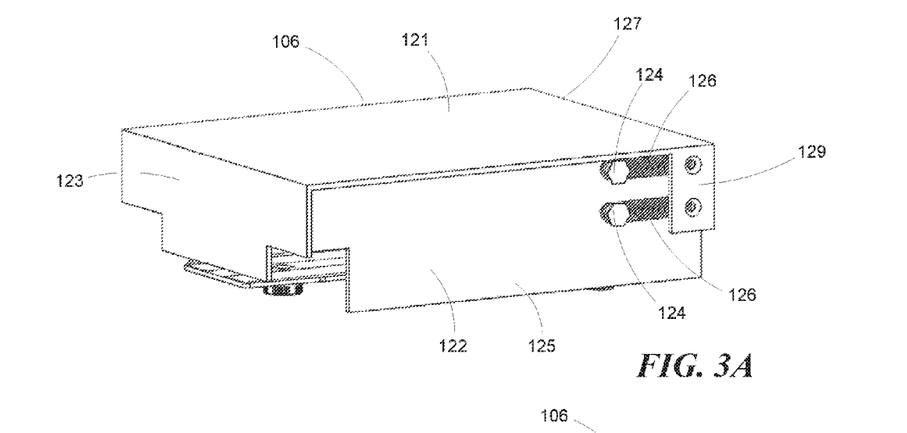
FIG. 3A is an isometric view of the conductor cover in the first position.
Figure 3B:
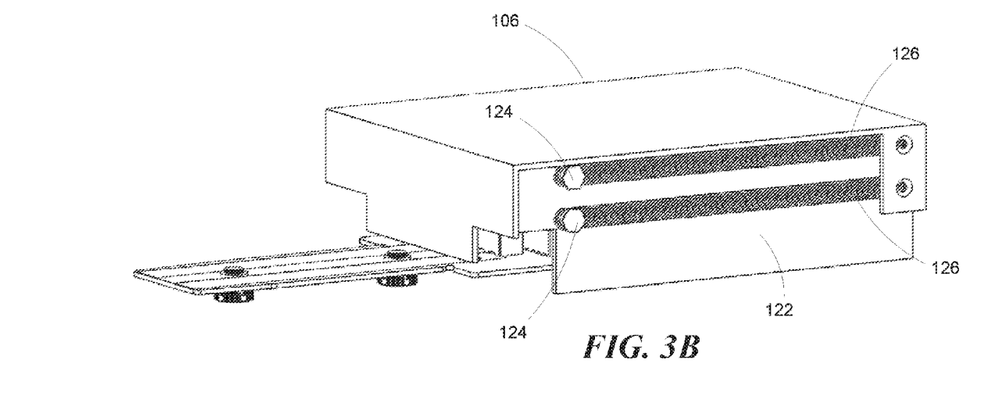
FIG. 3B is an isometric view of the conductor cover in the second position.

As shown in FIGS. 3A and 3B, the conductor cover 106 includes a top panel 121, a front panel 123, a rear panel 127, and a pair of side panels 125. The side panels 125 are inset from the edges of the other panels to provide recessed regions 122 (one on each side of the cover) each of which provides space for a pair of return springs 126. The return springs 126 bias the conductor cover 106 toward the covered first position (FIG. 3A).

In some embodiments, the return springs 126 can be extension springs, as shown, such that the springs 126 are in a relaxed state when the conductor cover 106 is in the first position (FIG. 3A) and in an extended (i.e., energized) state when the conductor cover 106 is in the second position (FIG. 3B). The return springs 126 are each coupled to the conductor cover 106 at one end and to the tray chassis 110 (FIG. 2B) at the opposite end. The conductor cover 106 includes spring tabs 129 to which the return springs 126 can be coupled. The tray chassis 110 includes mounting posts 124 extending from the sidewalls 112 (FIG. 2B) for connecting the return springs 126 to the tray chassis 110.

Figure 4:
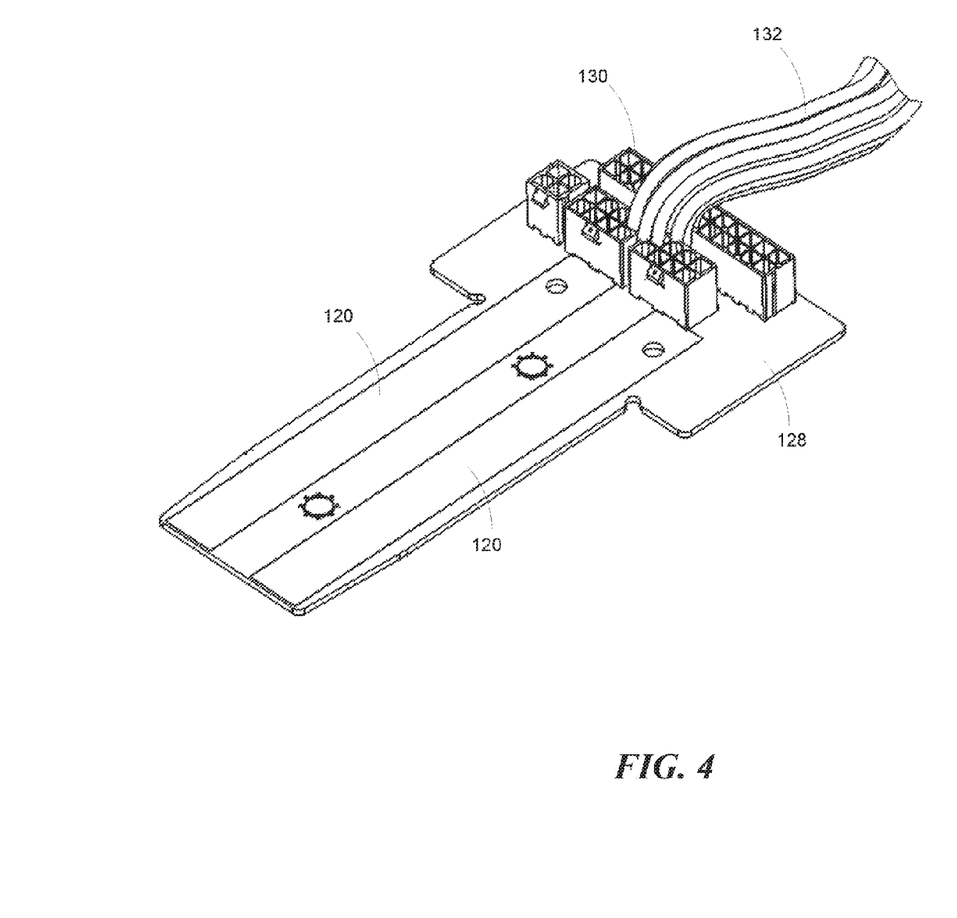
FIG. 4 is an isometric view of a pair of conductors according to a representative embodiment.

As shown in FIG. 4, the conductors 120 are disposed on a conductor support 128, such as a conductor printed circuit board (PCB). One or more tray connectors 130 are mounted on the conductor support 128 and provide an electrical connection between the conductors 120 and the power supply cable 132.

Figure 5:
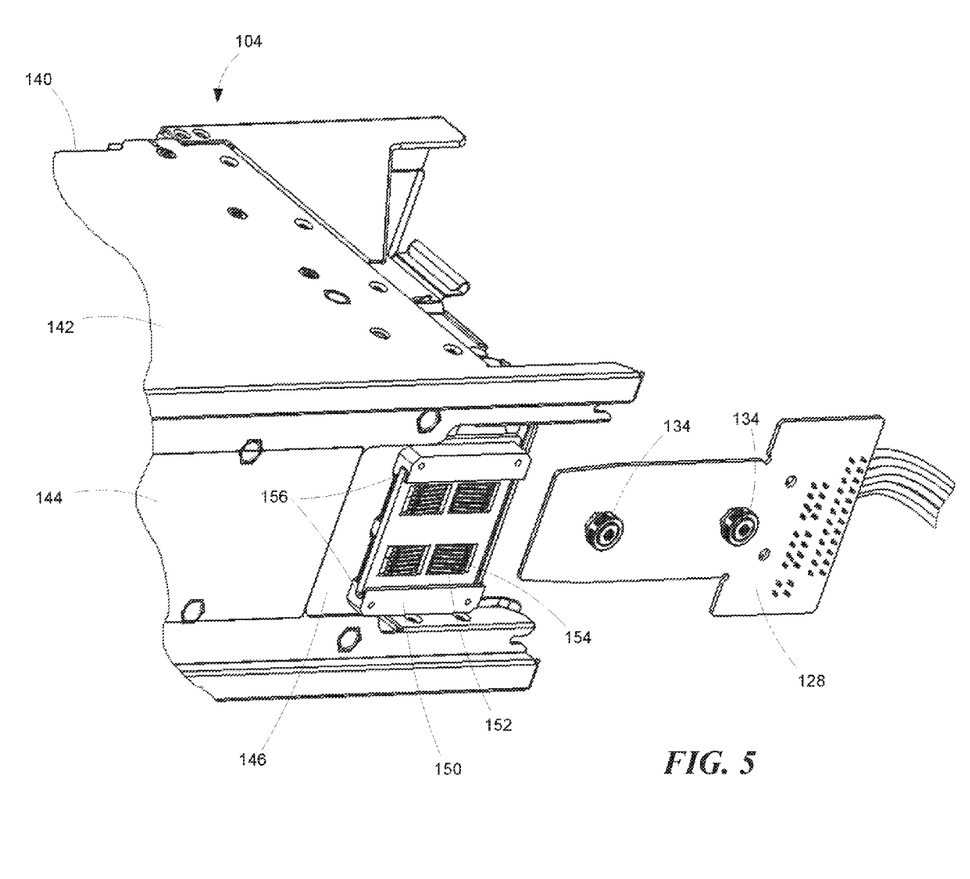
FIG. 5 is a partial isometric view of the device sled as viewed from underneath.

With reference to FIG. 5, the device (e.g., server and/or memory) sled 104 includes a sled chassis 140 having a pair of chassis sidewalls 142 and a chassis bottom wall 144. A chassis panel 146, such as a base-plane PCB, is mounted to the bottom wall 144 of the sled chassis 140. Two or more conductive elements 152 are mounted on the chassis panel 146 and positioned for sliding contact with the pair of conductors 120 (FIG. 4) when the device sled 140 is in the powered position (FIG. 1B). The conductive elements 152 are operatively coupled to electronic components in the device sled 104 and configured to provide power to the components when the device sled 140 is in the powered position.

In some embodiments, the conductive elements 152 are spring biased toward the pair of elongate conductors 120. A conductor guide 150 is mounted to the chassis panel 146 and surrounds the conductive elements 152. In some embodiments, the conductor guide 150 includes a pair of opposed grooves 156 adapted to slideably receive the conductor support 128. The conductive elements 152 can include a surface mount portion with a plurality of fingers 154 extending therefrom. In some embodiments, the conductor elements 152 can be surface mounted (e.g., soldered) to the chassis panel 146. The conductor support 128 is mounted to and spaced apart from the tray bottom wall 114 (FIG. 2A) with suitable mounting fasteners 134.

In operation, the device sled 104 is axially aligned with the power tray 102 and positioned atop the bottom wall 114 and between the sidewalls 112 (FIG. 2A). The sidewalls 112 are shaped and sized to keep the device sled 104 properly aligned so the conductor guide 150 and the conductor elements 152 are aligned with the conductors 120 on the conductor support 128, which remain covered and protected by the cover 106 until the device sled engages the cover. As the device sled 104 is moved axially toward the powered position (FIG. 1B), the end of the device sled 104 pressed against the leading edge of the cover 106, so as to push the cover axially along the sidewalls 112 and at least partially under the stationary cover 116. When the device sled 104 moves into the powered position, the device sled moves over and covers the conductors 120 of the power tray 102 as the conductive elements 152 slide into electrical engagement with conductors 120, such that the conductors 120 are always covered and blocked from exposure and inadvertent contact with anything other than the device sled 104.

Figure 6:
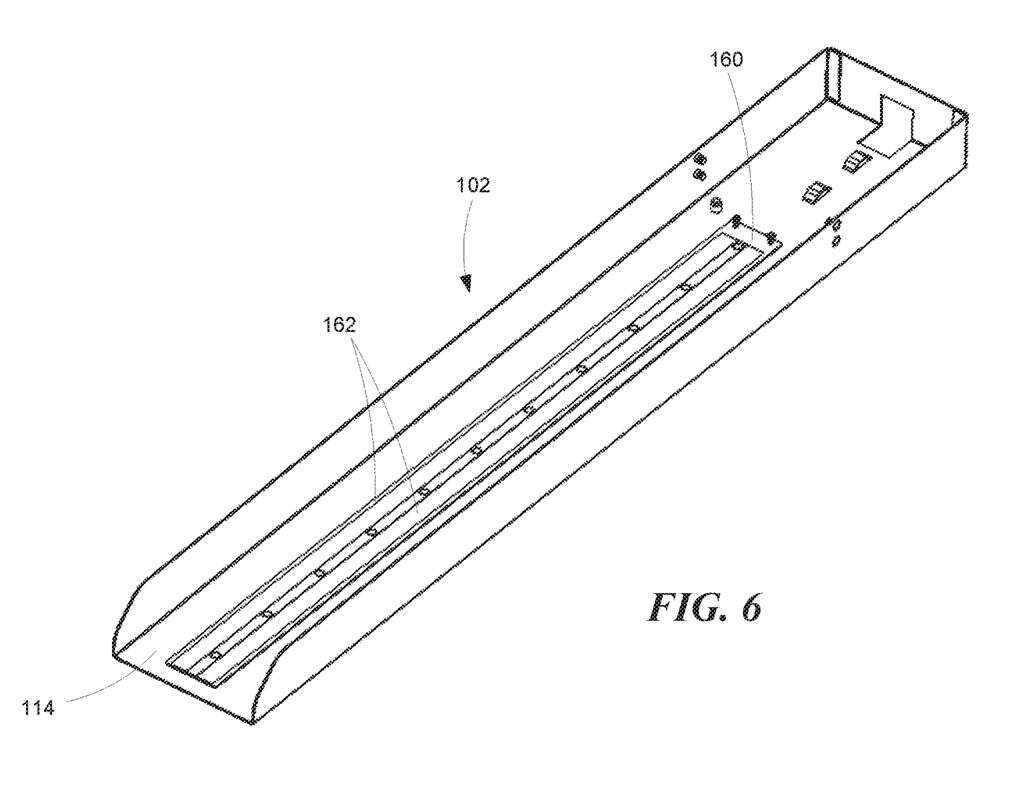
FIG. 6 is an isometric view of a pair of elongate conductors according to another representative embodiment.

FIG. 6 illustrates a pair of elongate conductors 162 according to another representative embodiment. The elongate conductors 162 extend most of the length of the tray bottom wall 114 and can provide power to a device sled 140 along the entire length of the power tray 102. The elongate conductors 162 are disposed on a corresponding conductor support PCB 160 which is attached to the tray bottom wall 114. The elongate conductors 162 can be useful in testing a device sled 140 while the device platform 100 is installed in a component rack (not shown) rather than during bench top testing, for example. The elongate conductors 162 allow the device sled 140 to remain powered while the device sled 140 is extended from the rack to gain access to the components within the sled 140. The elongate conductors 162 may or may not be used with the cover 106. By virtue of being located within a component rack, the elongate conductors 162 are blocked from exposure and inadvertent contact.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A device platform, comprising:
  a power tray, comprising:
    a tray chassis having a tray sidewall and a tray bottom wall;
    a pair of conductors extending along at least a portion of the tray chassis; and
    a conductor cover moveable between a first position where the pair of conductors are covered and a second position where the pair of conductors are exposed;
  a power supply connected to the pair of conductors; and
  a device sled moveably positioned on the power tray and moveable relative to the pair of conductors between an unpowered position where the conductor cover is in the first position and a powered position where the conductor cover is in the second position, the device sled comprising:
    a sled chassis having a chassis sidewall and a chassis bottom wall;
    a chassis panel mounted to the sled chassis; and
    two or more conductive elements mounted on the chassis panel and positioned for sliding contact with the pair of conductors when the device sled is in the powered position.

2. The device platform of claim 1, wherein the pair of conductors are disposed on a conductor support.

3. The device platform of claim 2, further comprising a tray connector mounted on the conductor support in electrical communication with the pair of conductors and connected to the power supply.

4. The device platform of claim 2, wherein the conductor support is spaced apart from the tray chassis.

5. The device platform of claim 4, further comprising a conductor guide mounted to the chassis panel adjacent to the two or more conductive elements.

6. The device platform of claim 5, wherein the conductor guide includes a pair of opposed grooves adapted to slideably receive the conductor support.

7. The device platform of claim 1, wherein the two or more conductive elements are spring biased toward the pair of conductors when the device sled is in the powered position.

8. The device platform of claim 7, wherein the two or more conductive elements each includes one or more fingers.

9. A server platform, comprising:
  a power tray, comprising:
    a tray chassis having a tray sidewall and a tray bottom wall;
    a pair of conductors extending along at least a portion of the tray bottom wall; and
    a conductor cover moveable between a first position where the pair of conductors are covered and a second position where the pair of conductors are exposed;
  a power supply connected to the pair of conductors; and
  a server sled movably positioned on the power tray and movable relative to the pair of conductors between an unpowered position where the conductor cover is in the first position and a powered position where the conductor cover is in the second position, the server sled comprising:
    a sled chassis having a chassis sidewall and a chassis bottom wall adjacent to the tray sidewall and tray bottom wall, respectively; and
    two or more conductive elements positioned for sliding contact with the pair of conductors, when the server sled is in the powered position.

10. The server platform of claim 9, wherein the conductor cover is biased toward the first position.

11. The server platform of claim 9, wherein the pair of conductors are disposed on a conductor PCB.

12. The server platform of claim 11, wherein the conductor PCB is spaced apart from the tray bottom wall.

13. The server platform of claim 12, further comprising a conductor guide mounted to a chassis panel and surrounding the two or more conductive elements.

14. The server platform of claim 13, wherein the conductor guide includes a pair of opposed grooves adapted to slideably receive the conductor PCB.

15. The server platform of claim 9, wherein the two or more conductive elements are spring biased toward the pair of conductors when the server sled is in the powered position.

16. The server platform of claim 15, wherein the two or more conductive elements each includes one or more fingers.

17. A server platform, comprising:
  a power tray, comprising:
    a tray chassis having a tray sidewall and a tray bottom wall;
    a pair of elongate conductors disposed on a conductor PCB extending along and spaced apart from at least a portion of the tray bottom wall;
    a tray connector mounted on the conductor PCB and in electrical communication with the pair of elongate conductors; and
    a conductor cover moveable between a first position where the pair of elongate conductors are covered and a second position where the pair of elongate conductors are exposed;
  a power supply connected to the tray connector; and
  a server sled movably positioned on the power tray and movable relative to the pair of elongate conductors between an unpowered position where the conductor cover is in the first position and a powered position where the conductor cover is in the second position, the server sled comprising:
    a sled chassis having a chassis sidewall and a chassis bottom wall;
    a base-plane PCB mounted to the chassis bottom wall;
    two or more conductive elements mounted on the base-plane PCB and positioned for sliding contact with the pair of elongate conductors when the server sled is in the powered position; and a conductor guide mounted to the base-plane PCB and surrounding the two or more conductive elements, wherein the conductor guide includes a pair of opposed grooves adapted to slideably receive the conductor PCB.

18. The server platform of claim 17, wherein the conductor cover is biased toward the first position.

19. The server platform of claim 17, wherein the two or more conductive elements are spring biased toward the pair of elongate conductors.

20. The server platform of claim 19, wherein the two or more conductive elements each includes one or more fingers.

* * * * *